Figure 1:
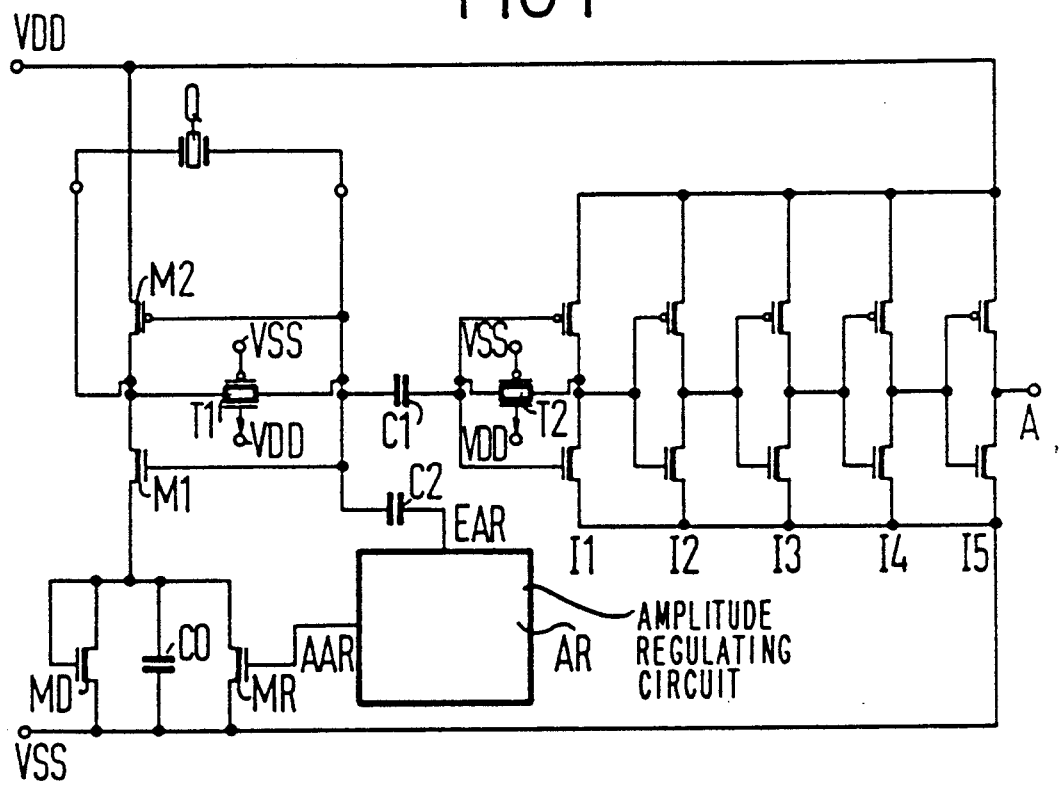

United States Patent [19]

Koch

[11] Patent Number: 4,999,588
[45] Date of Patent: Mar. 12, 1991

[54] INTEGRATABLE AMPLITUDE-REGULATED OSCILLATOR CIRCUIT

[75] Inventor: Rudolf Koch, Unterhaching, Fed. Rep. of Germany

[73] Assignee: Siemens Aktiengesellschaft, Munich, Fed. Rep. of Germany

[21] Appl. No.: 488,692

[22] Filed: Mar. 5, 1990

[30] Foreign Application Priority Data

Mar. 3, 1989 [EP] European Pat. Off. ......... 89103800.2

[51] Int. Cl.$^5$ .......................... H03B 5/36; H03L 5/00
[52] U.S. Cl. ............................. 331/109; 331/116 FE; 331/183
[58] Field of Search ................. 331/104, 116 FE, 183

[56] References Cited

FOREIGN PATENT DOCUMENTS 0050583 4/1982 European Pat. Off. .
0299215 1/1989 European Pat. Off. .
3223338 1/1984 Fed. Rep. of Germany .

OTHER PUBLICATIONS

Publication IEEE Solid State Circuits, vol. 23, No. 3, Jun. 1988; Eric A. Vittoz et al., "High-Performance Crystal Oscillator Circuits: Theory and Application", pp. 774–782.

Primary Examiner—Siegfried H. Grimm
Attorney, Agent, or Firm—Herbert L. Lerner; Laurence A. Greenberg

[57] ABSTRACT

An integratable amplitude-regulated oscillator circuit includes a resonator element, a control element having a control input, an inverter having an output and an input coupled to one another through the resonator element and having a quadrature-axis current component being variable by the control element, an amplitude regulating circuit having an input connected to the input of the inverter and an output connected to the control input of the control element, and an output stage having an input connected to the input of the inverter. The amplitude regulating circuit includes a differential amplifier having an inverting input and a non-inverting input, a first peak value rectifier connected upstream of the inverting input, and a second peak value rectifier connected upstream of the non-inverting input. The first peak value rectifier is acted upon by a sum of a signal voltage present at the input of the inverter and a first auxiliary voltage derived from a reference voltage, and the second peak value rectifier is acted upon by a second auxiliary voltage derived from the reference voltage.

16 Claims, 1 Drawing Sheet

INTEGRATABLE AMPLITUDE-REGULATED OSCILLATOR CIRCUIT

The invention relates to an integratable amplitude-regulated oscillator circuit having an inverter with an output and an input coupled to one another through a resonator element and a quadrature-axis current component being variable through a control element, an amplitude regulating circuit with an input connected to the input of the inverter and an output connected to a control input of the control element, and an output stage with an input connected to the input of the inverter.

In order to function, integrated circuits often require a cadence, which is typically generated in an oscillator circuit that is formed of an integrated amplifier and a resonator element (usually an oscillator quartz or crystal), and load capacitors. The integrated amplifier, which will hereinafter be called an inverter, is generally wired according to the principle of the Pierce oscillator. However, contradictory demands are made of such an oscillator. On one hand, rapid stimulation of oscillations should be assured even under unfavorable conditions (low supply voltage, high temperature, relatively low-quality quartz, high load capacitance), which require a relatively high current and a high rate of rise of the circuit. On the other hand, in the steady state of the circuit, the oscillation amplitude should not drop below nor exceed the supply voltage, even under favorable conditions (high supply voltage, high-quality quartz), because otherwise the power consumption becomes unnecessarily high, and charge carrier injections into the substrate can furthermore cause disturbances in the integrated circuit. In order to meet such a requirement, only low currents and rise rates are permissible.

In many circuits, the oscillator is only dimensioned for security in terms of stimulation of oscillation, and the above-mentioned limitations in the steady state are accepted into the bargain. Particularly into clock circuits, an oscillator on the principle of the Pierce oscillator was developed as described by Vittoz et al, in "High-Performance Crystal Oscillator Circuits", IEEE Journal of Solid State Circuits, Vol. SC-23, No. 3, June 1988. That oscillator assures the stimulation of oscillation with a high current and a high rise rate, and in the steady state it limits the oscillation amplitude with a reduced current. In the oscillator described above, at least some transistors must operate in the so-called sub-threshold range, or in other words with very low current density. This is possible with merely a 32 KHz oscillator frequency, but for the primarily intended application of that oscillator, problems do arise at high oscillation frequencies in the MHz range. For these high frequencies, substantially higher currents and rise rates are necessary, so that operation of the transistors in the sub-threshold range is no longer practical, because of the large structures then required. Furthermore, the known oscillator is vulnerable to parameter fluctuations, if individual transistors, particularly in the amplitude regulating stage, are not operated in the sub-threshold range. Further, the actual oscillator circuit can only be supplied with a limited current in the sub-threshold range through the current mirror feeding it. Such a current is substantially lower than the quadrature-axis current component flowing in a conventional inverter. For these reasons, the known oscillator is less suitable for frequencies in the MHz range, because of the higher currents then required.

It is accordingly an object of the invention to provide an integratable amplitude-regulated oscillator circuit, which overcomes the hereinafore-mentioned disadvantages of the heretofore-known devices of this general type and which has amplitude regulation that is usable for higher frequencies.

With the foregoing and other objects in view there is provided, in accordance with the invention, an integratable amplitude-regulated oscillator circuit, comprising an oscillator element, a control element having a control input, an inverter having an output and an input coupled to one another through the resonator element and having a quadrature-axis current component being variable by the control element, an amplitude regulating circuit having an input connected to the input of the inverter and an output connected to the control input of the control element, and an output stage having an input connected to the input of the inverter; the amplitude regulating circuit including a differential amplifier having an inverting input and a non-inverting input, a first peak value rectifier connected upstream of the inverting input, and a second peak value rectifier connected upstream of the non-inverting input; the first peak value rectifier being acted upon by a sum of a signal voltage present at the input of the inverter and a first auxiliary voltage derived from a reference voltage, and the second peak value rectifier being acted upon by a second auxiliary voltage derived from the reference voltage.

In accordance with another feature of the invention, the resonator element is an oscillator crystal.

In accordance with a further feature of the invention, there is provided a capacitor connected between the output stage and the inverter.

In accordance with an added feature of the invention, the inverter includes an NMOS transistor having a source branch and a controllable current source connected in the source branch as a control element.

In accordance with an additional feature of the invention, the inverter includes two complementary MOS transistors in a push-pull connection.

In accordance with yet another feature of the invention, the control element is an MOS transistor.

In accordance with yet a further feature of the invention, there is provided a diode connected in parallel with the MOS transistor of the control element in the conducting direction.

In accordance with yet an added feature of the invention, there is provided a capacitor connected in parallel with the MOS transistor of the control element.

In accordance with yet an additional feature of the invention, the output stage is at least one further inverter.

In accordance with again another feature of the invention, the differential amplifier has an output, and there is provided a capacitor connected in parallel with the output of the differential amplifier.

In accordance with again a further feature of the invention, there is provided a capacitor connected between the amplitude regulating circuit and the inverter.

In accordance with again an added feature of the invention, the peak value rectifiers each include one MOS transistor, current impressing means being connected to the MOS transistor as a source follower and having an output side, and a smoothing capacitor connected to the output side of the current impressing means.

In accordance with again an additional feature of the invention, there is provided at least one voltage divider generating the first and second auxiliary voltages from the reference voltage.

In accordance with a concomitant feature of the invention, the two peak value rectifiers are identical.

The advantages of an oscillator circuit according to the invention are that a high current assures reliable stimulation of oscillation, while in the steady state the current is reduced even at high frequencies. It is also advantageous that the oscillation amplitude can be adjusted independently of any parameter fluctuations.

Other features which are considered as characteristic for the invention are set forth in the appended claims.

Although the invention is illustrated and described herein as embodied in an integratable amplitude-regulated oscillator circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
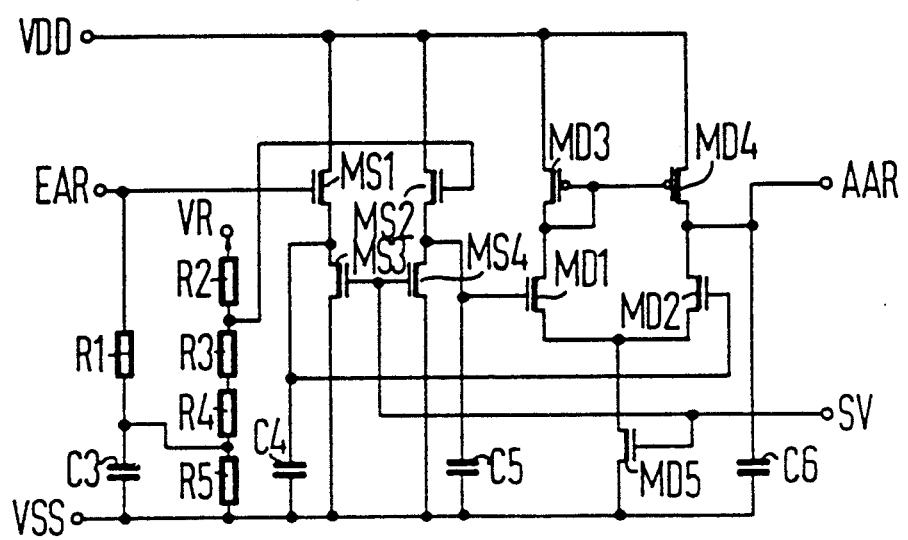

FIG. 1 is a schematic and block circuit diagram of an embodiment of an oscillator circuit; and FIG. 2 is a circuit diagram of an embodiment of an amplitude regulating circuit in accordance with the invention, to be used in the oscillator circuit of FIG. 1.

Referring now in detail to the figures of the drawing in which identical elements are provided with the same reference numerals and first, particularly, to FIG. 1 thereof, there is seen an oscillator circuit in which an inverter is negatively fed back between the output and the input thereof by means of an oscillator crystal Q as a resonator element. The inverter is formed of two complementary MOS transistors, namely an NMOS transistor M1 and a PMOS transistor M2. The gate leads of the transistors are joined and form the inverter input, and the drain leads of the transistors are joined and form the inverter output. In addition, the inverter includes a transmission gate stage T1 with two complementary MOS transistors, the source-to-drain paths of which are parallel to the oscillator crystal Q. The gate lead of the PMOS transistor of the transmission gate stage T1 is connected to the negative pole VSS, and the gate lead of the NMOS transistor is connected to the positive pole VDD, of a supply voltage source which is not shown in further detail in the drawing. The source lead of the transistor M2 is also connected to the positive pole VDD. In contrast, the source lead of the transistor M1 is connected through the source-to-drain path of a further NMOS transistor MR to the negative pole VSS. The source-to-drain path of the transistor MR is connected in parallel with both a capacitor C0 and the source-to-drain path of an NMOS transistor MD that is operated as a diode by means of a connection of the gate and drain leads thereof. The gate lead of the transistor MR is connected to the output AAR of an amplitude regulating circuit AR, having an input EAR which is connected through a capacitor C2 to the input of the inverter. An output stage leading to an output A is also coupled to the input of the inverter, through a capacitor C1. The output stage is formed of five series-connected inverters I1-I5 each having two complementary MOS transistors. A transmission gate T2 is also connected in parallel with the inverter I1 which is disposed at the input of the output stage.

As shown in FIG. 2, the amplitude regulating circuit AR of FIG. 1 includes a differential amplifier, having a first peak value rectifier preceding the inverting input and a second peak value rectifier preceding the non-inverting input thereof. The differential amplifier is formed of two source-coupled NMOS transistors MD1, MD2, the drain leads of which are each connected to the drain lead of a respective one of two PMOS transistors MD3 and MD4, the source leads of which are connected in a current mirror circuit to the positive pole VDD. The coupled source leads of the transistors MD1 and MD2 are connected through the drain-to-source path of an NMOS transistor MD5 to the negative pole VSS. The gate lead of the transistor MD5 is acted upon by a trigger voltage SV that is positive with respect to the negative pole VSS.

Two peak value rectifiers are each identically formed of a first transistor having a drain lead connected to the positive pole VDD, and a second transistor having a source lead connected to the negative pole VSS; the source lead of the first transistor and the drain lead of the second transistor are joined and connected to a smoothing capacitor leading to the negative pole VSS. The first peak value rectifier has an NMOS transistor MS2 which is the first transistor, an NMOS transistor MS4 which is the second transistor and a capacitor C5 which is the the smoothing capacitor. Correspondingly, in the second peak value rectifier, an NMOS transistor MS1 forms the first transistor, an NMOS transistor MS3 forms the second transistor, and a capacitor C4 forms the smoothing capacitor. As already described above, the leads of the smoothing capacitors which are not connected to the negative pole VSS are each connected to one of the inputs of the differential amplifier. The gate leads of the transistors MS3 and MS4 are each acted upon by the trigger voltage SV, each forming current impressing means. The trigger voltage SV may have a behavior that compensates for the temperature drift of the transistors MS3, MS4 and MD5. In order to generate two auxiliary voltages, the amplitude regulating circuit AR also has a voltage divider, having resistors R2, R3, R4 and R5 connected in series from a positive pole VR of a reference voltage source which is not shown in further detail, to the negative pole VSS of the reference and supply voltage source. The gate lead of the transistor MS2 is carried to the pickup between the resistor R2 and the resistor R3. The gate lead of the transistor MS1 that forms the input of the amplitude regulating circuit AR is connected through a resistor R1 to the pickup between the resistor R4 and the resistor R5, to which a capacitor C3 is connected in parallel. Finally, the output of the differential amplifier, providing the output AAR of the amplitude regulating circuit AR, is carried through a capacitor C6 to the negative pole VSS.

Since the basic layout of the circuit configuration according to the invention which is shown in the drawing figures has been explained, its mode of operation will be described in further detail.

The actual oscillator is formed of the inverter, which is in turn formed of the transistors M1 and M2. The average current flowing in the transistors M1 and M2 is adjusted by the amplitude regulating circuit AR through the transistor MR provided as a control element or final control element. In order to advantageously prevent a complete downward regulation or shutdown of the inverter, the transistor MD which is wired as a diode is connected in parallel with the transistor MR. According to a feature of the invention, the capacitor C0 bypasses or bridges the transistor MR for alternating voltages. The oscillation of the oscillator is fed through the capacitor C1 to an inverter chain having the five series-connected inverters I1–I5, where it is made steep, and it can be picked up as a rectangular signal at the output A. The first inverter I1 is preferably capacitively coupled, so that the shifting of the operating points of the transistors M1 and M2 resulting from the regulation does not affect the duty cycle of the rectangular pulse at the output A. According to another feature of the invention, the inverter of the oscillator has the transmission gate T1 for adjusting the operating point. Instead of the inverter having the transistors M1, M2, a single larger PMOS or NMOS transistor with a controllable current source in the drain branch can be used as a final control element, as disclosed in the known oscillator circuit. The essentially sinusoidal oscillator oscillation is also capacitively fed into the amplitude regulating circuit AR, through the other capacitor C2.

A peak value rectification of the oscillation is first performed with the transistors MS1 and MS3. The crest value of the oscillation is available through the capacitor C4 as a voltage U(C4) and can be expressed in the form of a formula as $$U(C4) = VR^* \cdot R5/(R2+R3+R4+R5) - UGS(MS1) + US.$$

where US is the crest amplitude of the oscillation and UGS(MS1) is the gate-to-source voltage of the transistor MS1. Through the capacitor C5, the voltage U(C4) is compared in the differential amplifier, which is formed of the transistors MD1–MD5, with the voltage U(C5), which is calculated as $$U(C5) = VR^* \cdot (R3+R4+R5) / (R2+R3+R4+R5) - UGS(MS2).$$

UGS(MS2) is the gate-to-source voltage of the transistor MS2. The differential amplifier adjusts the gate-to-source voltage of the transistor MR in such a way that the voltages U(C4) and U(C5) become equal. For the sake of symmetry, the gate-to-source voltages of the transistors MS1 and MS2 are equal in the regulated state. Therefore it follows that $$US = VR2^* \cdot (R3+R4) / (R2+R3+R4+R5).$$

Thus the oscillation amplitude is determined independently of parameter fluctuations through the reference voltage VR−VSS and the dimensioning of the voltage divider provided for generating the auxiliary voltages. The dominant pole of the regulating circuit is determined through the capacitor C6, thereby increasing the stability of the regulating circuit. For the case in which the supply voltage is available in sufficiently stable form, the possibility exists of applying the voltage divider R2 ... R5 to the supply voltage, rather than to a reference voltage.

I claim:

1. Integratable amplitude-regulated oscillator circuit, comprising a resonator element, a control element having a control input, an inverter having an output and an input coupled to one another through said resonator element and having a quadrature-axis current component being variable by said control element, an amplitude regulating circuit having an input connected to said input of said inverter and an output connected to said control input of said control element, and an output stage having an input connected to said input of said inverter;

said amplitude regulating circuit including a differential amplifier having an inverting input and a non-inverting input, a first peak value rectifier connected upstream of said inverting input, and a second peak value rectifier connected upstream of said non-inverting input;

said first peak value rectifier being acted upon by a sum of a signal voltage present at said input of said inverter and a first auxiliary voltage derived from a reference voltage, and said second peak value rectifier being acted upon by a second auxiliary voltage derived from the reference voltage.

2. Oscillator circuit according to claim 1, wherein said resonator element is an oscillator crystal.

3. Oscillator circuit according to claim 1, including a capacitor connected between the inputs of said output stage and said inverter.

4. Oscillator circuit according to claim 1, wherein said inverter includes an NMOS transistor having a source branch and a controllable current source connected in the source branch as said control element.

5. Oscillator circuit according to claim 1, wherein said inverter includes two complementary MOS transistors in a push-pull connection.

6. Oscillator circuit according to claim 1, wherein said control element is an MOS transistor.

7. Oscillator circuit according to claim 6, including a diode connected in parallel with said MOS transistor of said control element in the conducting direction.

8. Oscillator circuit according to claim 6, including a capacitor connected in parallel with said MOS transistor of said control element.

9. Oscillator circuit according to claim 7, including a capacitor connected in parallel with said MOS transistor of said control element.

10. Oscillator circuit according to claim 1, wherein said output stage is at least one further inverter.

11. Oscillator circuit according to claim 1, wherein said differential amplifier has an output, and including a capacitor connected with said output of said differential amplifier.

12. Oscillator circuit according to claim 1, including a capacitor connected between the inputs of said amplitude regulating circuit and said inverter.

13. Oscillator circuit according to claim 1, wherein said peak value rectifiers each include one MOS transistor, current impressing means being connected to said MOS transistor as a source follower and having an output side, and a smoothing capacitor connected to the output side of said current impressing means.

14. Oscillator circuit according to claim 1, including at least one voltage divider generating the first and second auxiliary voltages from the reference voltage.

15. Oscillator circuit according to claim 1, wherein said two peak value rectifiers are identical.

16. Integratable amplitude-regulated oscillator circuit, comprising a resonator element, a control element, an inverter connected to said resonator element and to said control element, an amplitude regulating circuit connected to said inverter and to said control element, and an output stage connected to said inverter, said amplitude regulating circuit including a differential amplifier and peak value rectifiers connected to said differential amplifier.

* * * * *